United States Patent
Xi et al.

(10) Patent No.: US 7,825,397 B2
(45) Date of Patent: Nov. 2, 2010

(54) SHORT BRIDGE PHASE CHANGE MEMORY CELLS

(75) Inventors: Haiwen Xi, Prior Lake, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 216 days.

(21) Appl. No.: 12/125,970

(22) Filed: May 23, 2008

(65) Prior Publication Data
US 2009/0289243 A1 Nov. 26, 2009

(51) Int. Cl.
*H01L 45/00* (2006.01)
(52) U.S. Cl. .................. 257/3; 257/4; 257/E45.002
(58) Field of Classification Search .............. 257/3, 257/4, E45.002
See application file for complete search history.

(56) References Cited

U.S. PATENT DOCUMENTS

| | | | |
|---|---|---|---|
| 4,409,262 A | | 10/1983 | Jelks et al. |
| 4,845,533 A | * | 7/1989 | Pryor et al. .................. 257/4 |
| 6,909,107 B2 | * | 6/2005 | Rodgers et al. .............. 257/3 |
| 2004/0166604 A1 | * | 8/2004 | Ha et al. ................... 438/102 |
| 2007/0008865 A1 | | 1/2007 | Adams |
| 2007/0018148 A1 | * | 1/2007 | Kuo et al. ................... 257/2 |
| 2007/0048674 A1 | | 3/2007 | Wells |
| 2008/0042118 A1 | * | 2/2008 | Hayakawa ................... 257/4 |

OTHER PUBLICATIONS

K.J. Lee et al., A 90nm 1.8v 512Mb Diode-Switch PRAM with 266MB/s Read Throughput, ISSCC 2007, Session 26, Non-Volatile Memories, 26.1, Feb. 2007.
Y.H. Ha, et al., An Edge Contact Type Cell for Phase Change RAM Featuring Very Low Power Consumption, 2003 Symposium on VLSI Technology Digest of Technical Papers, p. 176-176.
Y.C. Chen et al., Ultra-Thin Phase-Change Bridge Memory Device Using GeSb, IEDM Technology Digest 2006.
L. F. Sun et al., Shadow-Evaporated Nanometre-Sized Gaps and Their Use in Electrical Studies of Nanocrystals, Nanotechnology 16 (2005) 631-634.
Yasuhisa Naitoh et al., Resistance Switch Employing a Simple Metal Nanogap Junction, Nanotechnology 17 (2006) 5669-5674.

* cited by examiner

*Primary Examiner*—Jerome Jackson, Jr.
*Assistant Examiner*—Paul A Budd
(74) *Attorney, Agent, or Firm*—Campbell Nelson Whipps LLC

(57) ABSTRACT

Random access memory cells having a short phase change bridge structure and methods of making the bridge structure via shadow deposition. The short bridge structure reduces the heating efficiency needed to switch the logic state of the memory cell. In one particular embodiment, the memory cell has a first electrode and a second electrode with a gap therebetween. The first electrode has an end at least partially non-orthogonal to the substrate and the second electrode has an end at least partially non-orthogonal to the substrate. A phase change material bridge extends over at least a portion of the first electrode, over at least a portion of the second electrode, and within the gap. An insulative material encompasses at least a portion of the phase change material bridge.

17 Claims, 4 Drawing Sheets

SHORT BRIDGE PHASE CHANGE MEMORY CELLS

BACKGROUND

Recently, phase change random access memory (PCRAM) having a capacity of 512 Mb using 90 nm node technology has been created. This PCRAM is intended to replace NOR flash in non-volatile memory markets. However, the set and reset currents and energy needed for the programming operation of these PCRAM devices are high. There are on-going attempts, both in material engineering and process optimization, to reduce these set and reset currents and to increase the memory density of the device.

The present disclosure provides memory cells that have reduced programming currents.

BRIEF SUMMARY

The present disclosure relates to random access memory and memory cells or units having a short phase change bridge structure and methods of making the bridge structure. The gap between electrodes is short, no more than about 100 nm, thus requiring a short bridge and utilizing reduced programming currents. The short bridge structure reduces the heating energy needed to switch the logic state of the memory cell. Methods of making a memory cell or unit having a phase change bridge structure using shadow deposition are also described.

In one particular embodiment of this disclosure, a phase change memory cell or unit is provided that has a first electrode and a second electrode proximate a substrate. The first electrode has a first layer comprising a first conductive material and a second layer comprising a second conductive material. The first electrode has an end at least partially non-orthogonal to the substrate. The second electrode is spaced from the first electrode, forming a gap of no more than about 100 nm therebetween. The second electrode comprises the second conductive material and has an end at least partially non-orthogonal to the substrate. A phase change material bridge contacts and connects the first electrode and the second electrode, and is present within the gap. An insulative material is present over the phase change material bridge. In some embodiments, it is an end of the second layer of the first electrode that is non-orthogonal to the substrate.

In another particular embodiment, this disclosure is directed to a method of making a phase change memory cell or unit. The method includes providing a first conductive material on a first region of a substrate. Then, a second conductive material is shadow deposited in the first region and on a second region of the substrate, leaving a gap between the first region and the second region. The first and second conductive materials in the first region form a first electrode and the second conductive material in the second region form a second electrode. A phase change material is applied to contact and connect the first electrode and the second electrode, and is present in the gap therebetween. An insulative material is applied over the phase change material.

BRIEF DESCRIPTION OF THE DRAWING

The invention may be more completely understood in consideration of the following detailed description of various embodiments of the invention in connection with the accompanying drawing, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The present disclosure is directed to random access memory and memory cells having a phase change bridge structure with a very short bridge length. The short bridge structure reduces the heating energy needed to switch the logic state of the memory cell. Methods of making a memory cell having a phase change bridge structure using shadow deposition are also described.

In accordance with this disclosure, the bridge structure of the phase change random access memory (PCRAM) device is a phase change material bar patterned over two adjacent yet separated electrodes. The gap between the electrodes is filled with the phase change material. The performance of the PCRAM is dependent on the thickness or width of the gap between the electrodes, and the thickness and width of the phase change bridge.

While the present invention is not so limited, an appreciation of various aspects of the invention will be gained through a discussion of the examples provided below.

Figure 1:
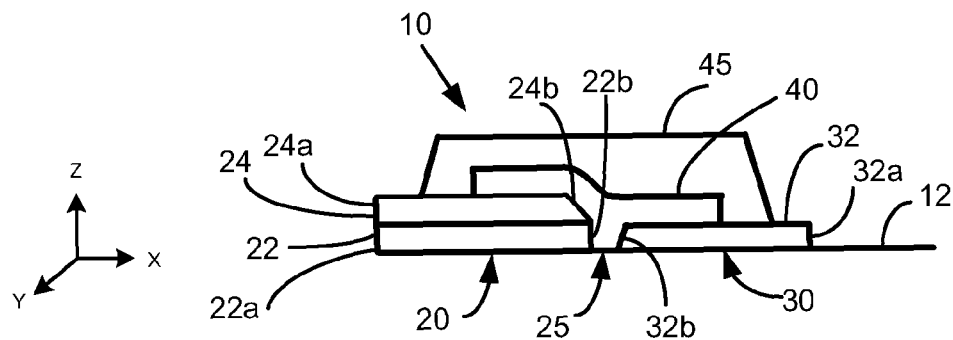
FIG. 1 is a schematic cross-section side view diagram of an exemplary memory cell according to the present invention.

Referring to FIG. 1, a first exemplary non-volatile memory cell according to this invention is illustrated as memory cell or unit 10. Memory unit 10 includes a substrate 12 having thereon a first electrode 20 physically spaced from a second electrode 30 in the X-direction by a gap 25. First electrode 20 includes a first layer 22 proximate substrate 12 and a second layer 24 proximate first layer 22. Second electrode 30 has a first layer 32. Although first layers 22, 32 are illustrated directly on substrate 12 and second layer 24 is illustrated directly on first layer 22, it is understood that other layers, such as seed layers, capping layers or other layers that do not affect the construction of memory unit 10 in respect to this invention may be present therebetween.

Electrodes 20, 30 are electrically conducting and typically composed of at least one electrically conducting metal, metal oxide or metal nitride. In the illustrated embodiment, electrode 20 is formed of two layers 22, 24 of electrically conducting metal, metal oxide or metal nitride and electrode 30 has one layer 32 of electrically conducting metal, metal oxide or metal nitride. Layer 24 may be the same as or different than layer 22. In most embodiments, layer 32 is the same as layer 24, however, in alternate embodiments, layer 32 could be different than each of layer 22 and layer 24. In some embodiments, any of layers 22, 24, 32 may be composed of multiple layers; for example, first layer could be layered Au and NiCr. Suitable materials for layers 22, 24, 32 include, but are not limited to, copper, silver, gold tungsten, titanium, aluminum, nickel, chromium, oxides thereof, nitrides thereof, and combinations and alloys thereof.

Each layer 22, 24, 32 usually has a thickness (in the Z-direction) of about 5 nm to about 100 nm. Of course, thicker and thinner layers are also suitable. In most embodiments, layer 24 of first electrode 20 and layer 32 of second electrode 30 will have the same or approximately the same thickness, because these two layers 24, 32 are deposited simultaneously by the same step, as described below. In these embodiments, electrode 20 will be thicker than electrode 30.

Each layer 22, 24, 32 has a first end and an opposite second end. Layer 22 has a first end 22a and a second end 22b; layer 24 has a first end 24a and a second end 24b; layer 32 has a first end 32a and a second end 32b. Ends 22b, 24b and 32b define gap 25. The length (in the X-direction, from the first end to the second end) of the layers of each electrode (e.g., layers 22, 24 of electrode 20 from end 22a to end 22b and from end 24a to end 24b) is about the same, for example, about 20 to 200 nm, although longer and shorter layers are also suitable. The width (in the Y-direction) of each layer 22, 24, 32 is about the same, for example, about 10 to 100 nm, although wider and narrower layers are also suitable. Usually, though not always, the length of layers 22, 23, 32 is greater than their width.

As readily seen in FIG. 1, electrode 20 includes at least a portion of an end that is non-orthogonal to substrate 12. In this embodiment, end 24b of layer 24 is angled (other than 90 degrees) in relation to substrate 12 and end 22b of layer 22 is orthogonal to substrate 12. The angle is generally between about 5 to about 60 degrees from vertical, sometimes about 15 to about 45 degrees or to about 25 degrees. A larger angle, e.g., 45 degrees, provides a larger gap and has more manufacturing variability than a smaller angle, e.g., 10 degrees.

Electrode 30 may additionally have an end (i.e., end 32b) that is non-orthogonal to substrate 12. In some embodiments, the angle of end 32b is the same as that of the end of electrode 30, and end 32b is parallel to the angled portion of electrode 30 (e.g., end 24b), although the angle of end 32b may be different from the angle of electrode 30. In some embodiments, the angle of end 32b may be negative in relation to the angle of electrode 30; i.e., end 32b may lean the other direction of vertical than the angled end of electrode 30. See, for example, FIG. 1 which illustrates end 24b having an angle of about 45 degrees and end 32b having an angle of about −20 degrees.

The length of gap 25 (in the X-direction) is no more than about 100 nm and is usually about 5 nm to 60 nm wide, in some embodiments about 10 nm to 25 nm, at its narrowest point; that is, the distance between first electrode 20 and second electrode 30 is about 5 nm to 60 nm, or in some embodiments, about 10 nm to 25 nm. Sometimes, the length of gap 25 may be as little as about 3 nm. It is the process of depositing layers 24, 32, in accordance with this disclosure, that allows for such a short gap 25.

Positioned over at least a portion of electrode 20 and electrode 30 and present therebetween in gap 25 is a phase change material bridge 40. Phase change material bridge 40 extends from electrode 20 to electrode 30, forming an extension between electrode 20 and electrode 30. The length of bridge 40 (in the X-direction) is usually less than 100 nm, often about 20-75 nm. The width of bridge 40 (in the Y-direction) is usually about 5 to about 100 nm, and in some embodiments, is less than the width of electrodes 20, 30. In these embodiments, bridge 40 is typically centered on electrodes 20, 30 across gap 25. Bridge 40 is selectively electrically conducting, providing electrical connection between electrode 20 and electrode 30 on demand.

Bridge 40 is formed from a chalcogenide material, one that has a phase transition from amorphous to crystalline upon application of an external force, such as heat. Suitable phase change materials include, but are not limited to, binary and ternary compounds of Ge, Sb and Te, and any other materials that possess hysteretic phase change characteristics. The compounds involving Ge, Sb and Te are often referred to as GST compounds or materials. A specific example of a suitable material for bridge 40 is $Ge_2Sb_2Te_5$. In its standard phase, a chalcogenide material is in its amorphous state, having a high electrical resistivity. Upon the application of heat, for example by passing a current therethrough, the chalcogenide material transitions to its crystalline state, having a low electrical resistivity. The chalcogenide material can be reverted back to its amorphous state by melting, e.g., by the application of a higher heat.

Positioned over phase change material bridge 40 is a cap layer 45. Cap layer 45 can be an insulating material, such as an insulating dielectric. Cap layer 45 covers at least a portion of phase change material bridge 40, and in some embodiments, envelopes or encompasses bridge 40, both in the X- and Y-directions. It is not necessary for cap layer 45 to cover electrodes 20, 30 in either or both the X- or Y-direction. Suitable materials for cap layer 45 include, but are not limited to, silica, alumina, oxides thereof, nitrides thereof, and combinations thereof. A specific example of a suitable material for cap layer 45 is $Si_3N_4/Al_2O_3$.

Figure 2:
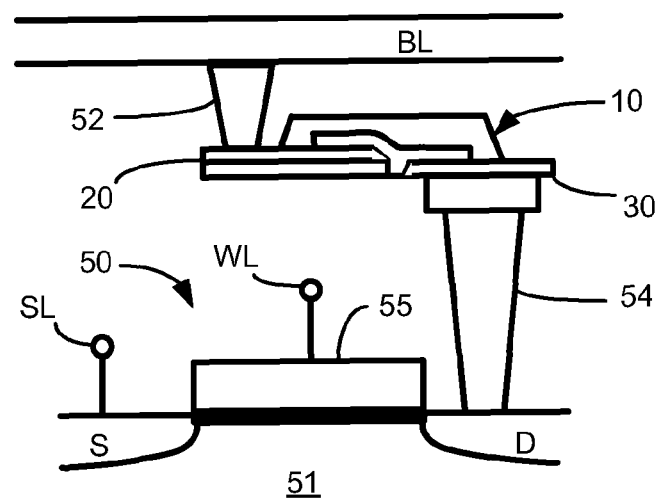
FIG. 2 is a schematic cross-section side view diagram of the memory cell of FIG. 1 operably connected to a control transistor and bit line.

FIG. 2 illustrates memory unit 10 electrically connected to a control transistor 50 at second electrode 30 and to a bit line BL at first electrode 20. Memory unit 10 is connected to bit line BL by a plug 52, extending from first electrode 20, e.g., from second layer 24 of first electrode 20. The plug 52 may alternately extend from second electrode 30. Memory unit 10 is also connected to control transistor 50 by a plug 54, extending from second electrode 30. Transistor 50 and variations thereof are well known. Simplified, transistor 50 includes an insulative substrate 51 having a source region S and a drain region D and a gate 55 therebetween. Electrically connected to source region S is a source line SL and electrically connected to gate 55 is a word line WL. Both source line SL and word line WL may extend orthogonal to bit line BL. Transistor 50 and the other elements of FIG. 2 and their connection to memory unit 10 can be formed using conventional semiconductor fabrication techniques. Additionally layers or elements may be present between memory unit 10 and bit line BL or drain region D.

Memory unit 10 is a non-volatile memory cell, capable of being switched from a first logic state (e.g., "0") to a second logic state (e.g., "1"). Memory unit 10 has phase change bridge 40 (FIG. 1) that is convertible from a high resistance (when amorphous) to low resistance (when crystalline). For example, high resistance may be defined as "0" and low resistance may be defined as "1". Memory unit 10 is switchable between the high resistance "0" to the low resistance "1" by the application of a current across phase change bridge 40. Current from bit line BL to first electrode 20 passes through bridge 40 and across gap 25 to second electrode 30 to drain region D. This exemplary current path can be used for both the write current and the read current.

To switch memory unit 10 from "0" to "1", a current with relatively low amplitude and long duration (e.g., about 100 µA to 1 mA for, e.g., about 300 ns) through bridge 40 heats the phase change material to a temperature below its melting temperature, and it changes from amorphous to crystalline, thus changing the state of memory unit 10 from "0" to "1". To switch memory cell from the "1" to "0". A current with relatively high amplitude (i.e., higher than the amplitude needed to switch from "0" to "1") and short duration (e.g., about 100 ns) through bridge 40 heats the phase change material to above its melting temperature and then lets it cool down rapidly, so that the atoms do not have time to relax into a crystalline lattice. Upon removal of the high amplitude current pulse, the phase change material is amorphous, thus having a high resistance and a state of "0". To read the state of memory unit 10 (i.e., rather a "1" or "0"), a read current having an amplitude lower than the lowest write current is passed through unit 10.

Figure 3A:
FIGS. 3A-3D are schematic side views of steps for forming the memory cell of FIG. 1.

Turning to FIGS. 3A through 3D, one method for manufacturing memory unit 10 is illustrated stepwise. In FIG. 3A, a first conductive material is applied to substrate 12, for example, by sputtering, physical vapor deposition, photolithography or other thin film processing techniques. To obtain the desired shape, a mask or other patterning material can be applied to substrate 12 and then removed after application of the first conductive material. This first conductive material forms a first layer 22 of first electrode 20 (FIG. 1).

Figure 3B:
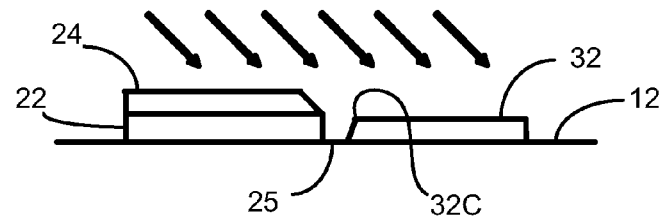

In FIG. 3B, a second conductive material is applied over first layer 22 and a portion of substrate 12. This application of the second material is done by shadow evaporation or shadow deposition of the second conductive material. A mask or other patterning mechanism may be used to position the second material where desired. With shadow evaporation, the second material is reliably and reproducibly applied to the desired location, within tolerance as small as 3 nm. Shadow evaporation uses angled deposition of the metal (e.g., second conductive material). In most embodiments, the angle of deposition is about 5 to about 60 degrees from vertical, sometimes about 15 to about 25 degrees or to about 45 degrees from vertical. The resulting layers formed by shadow evaporation have a side edge that is aligned with the angle of deposition; that is, the deposited material has an end that is angled in respect to vertical and to the substrate. The previously applied (e.g., deposited) first layer 22 provides a shadow on substrate 12 in which the second material does not deposit, resulting in a portion of substrate 12 having no first or second material thereon. This portion of substrate 12 lacking first and second material is the resulting gap 25.

In the illustrated method, the second material forms second layer 24 of first electrode 20 (FIG. 1) and also forms layer 32 of second electrode 30 (FIG. 1).

In an ideal process, layer 32 would have a side edge that is aligned with the angle of deposition; that is, the deposited material would have an end that is angled in respect to vertical and to the substrate, with this angle being the same as the angle of deposition. In practical application, however, as ions of the material being deposited impact the corner of layer 32 (designated as corner 32C in FIG. 3B), the impact deforms corner 32C, inhibiting the forming of a sharp corner. End 32b and corner 32C could be described as having an unpredictable angle or shape. In some embodiments, the resulting end of layer 32 is angled in the direction of the deposition but at a different angle, whereas in other embodiments (e.g., as illustrated in FIGS. 3B through 3D) the end of layer 32 is negative in relation to the direction of the deposition.

Figure 3C:
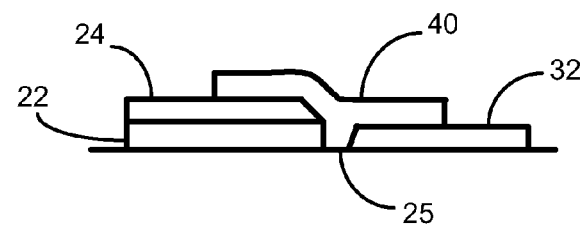

Over at least a portion of layers 22, 24 and layer 32 is deposited a phase change material (e.g., GST) to form a phase change data storage layer 40 that forms a bridge from layer 24 to layer 32 and fills in gap 25; see FIG. 3C. A mask or other patterning mechanism is applied in order to position phase change bridge 40 where desired. Phase change bridge 40 can be applied by any conventional method, such as sputtering, physical vapor deposition, photolithography or other thin film processing technique.

Figure 3D:
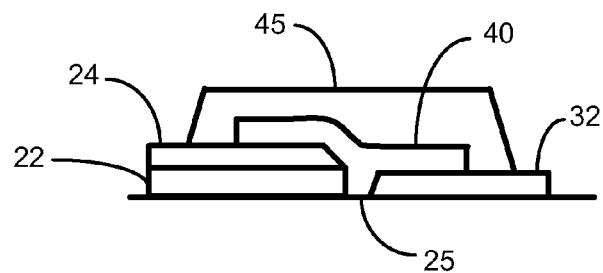

An electrically insulative layer 45 is applied over phase change bridge 40 in FIG. 3D. Insulative layer 45 can be applied by any conventional method, such as sputtering, physical vapor deposition, photolithography or other thin film processing technique.

Figure 4:
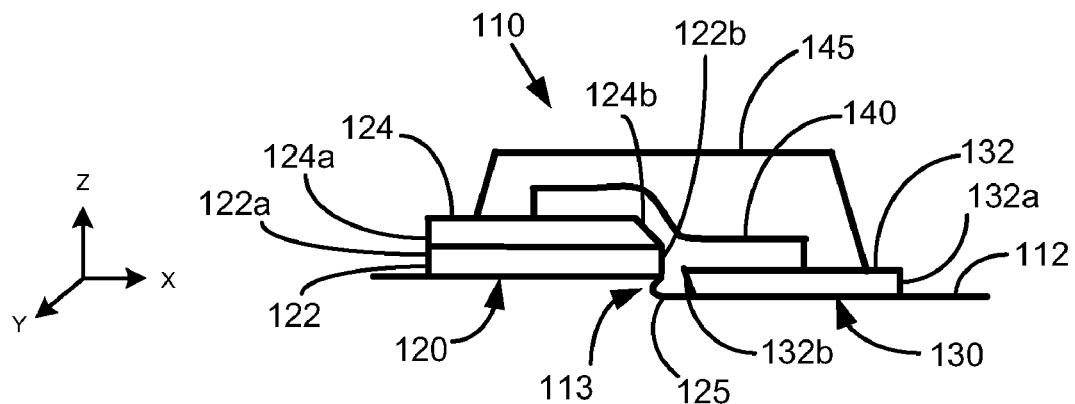
FIG. 4 is a schematic cross-section side view diagram of a second exemplary memory cell according to the present invention.

A second exemplary non-volatile memory cell according to this invention is illustrated as memory cell 110 in FIG. 4. The various elements of memory cell 110 have the same properties and qualities as the respective elements of memory unit 10, unless otherwise indicated.

Memory cell 110 includes a substrate 112 having thereon a first electrically conducting electrode 120 physically spaced from a second electrically conducting electrode 130 in the X-direction by a gap 125. First electrode 120 includes a first layer 122 proximate substrate 112 and a second layer 124 proximate first layer 122. Second electrode 130 has a first layer 132 proximate substrate 112. Unlike memory unit 10 of FIG. 1, however, substrate 112 is not planar and has a portion 113 on which layer 132 of memory cell 110 is positioned that is recessed in relation to the portion on which layer 122 is positioned.

Each layer 122, 124, 132 has a first end and an opposite second end. Layer 122 has a first end 122a and a second end 122b; layer 124 has a first end 124a and a second end 124b; layer 132 has a first end 132a and a second end 132b. Ends 122b, 124b and 132b define gap 125. Similar to memory unit 10, electrode 120 includes at least a portion of an end that is non-orthogonal to substrate 112. In this embodiment, end 124b of layer 124 is angled (other than 90 degrees) in relation to substrate 112 and end 122b of layer 122 is orthogonal to substrate 112. End 132b of electrode 130 may also be non-orthogonal to substrate 112. In FIG. 4, end 132b angles the same direction as end 124b, yet at a different angle. The length of gap 25 (in the X-direction), between electrode 120 and electrode 130, is no more than about 100 nm, and usually about 3 nm to 60 nm wide. By having electrode 130 recessed in relation to electrode 120, the length of gap 125 is less than if electrodes 120, 130 were co-planar.

Positioned over at least a portion of electrode 120 and electrode 130 and present therebetween in gap 125 is a phase change (e.g., chalcogenide) material bridge 140 that forms an extension between electrode 120 and electrode 130. Bridge 40 is selectively electrically conducting, providing electrical connection between electrode 20 and electrode 30 on demand. Because of the dropped electrode 130, the stepped nature of bridge 140 is accentuated.

Positioned over phase change material bridge 140 is an insulating cap layer 145.

Figure 5:
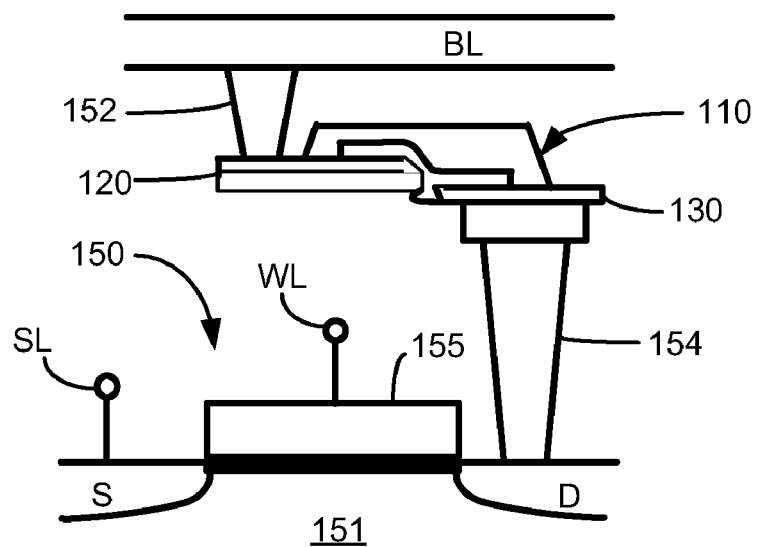
FIG. 5 is a schematic cross-section side view diagram of the memory cell of FIG. 4 operably connected to a control transistor and bit line.

FIG. 5 illustrates memory cell 110 electrically connected to a control transistor 150 at second electrode 130 and to a bit line BL at first electrode 120. Memory cell 110 is connected to bit line BL by a plug 152, extending from first electrode 120. Memory cell 110 is also connected to control transistor 150 by a plug 154, extending from second electrode 130. Transistor 150 and variations thereof are well known. Simplified, transistor 150 includes a substrate 151 having a source region S and a drain region D and a gate 155 therebetween. Electrically connected to source region S is a source line SL and electrically connected to gate 155 is a word line WL. Both source line SL and word line WL extend orthogonal to bit line BL.

Figure 6A:
FIGS. 6A-6E are schematic side views of steps for forming the memory cell of FIG. 4.

Turning to FIGS. 6A through 6E, one method for manufacturing memory cell 110 is illustrated stepwise. In FIG. 6A, a first conductive material is applied to substrate 112, for example, by sputtering, physical vapor deposition, photolithography or other thin film processing techniques. To obtain the desired shape, a mask or other patterning material can be applied to substrate 112 and then removed after application of the first conductive material. This first conductive material forms a first layer 122 of first electrode 120 (FIG. 4).

Figure 6B:
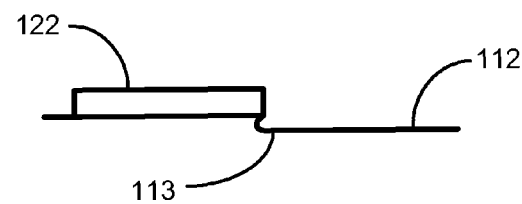

After the deposition of first layer 122, substrate 112 can be etched to form a recess 113, by methods that are well known; see FIG. 6B. This recess 113 may undercut first layer 122. The etching process may 'clean-up' or better define the end of first layer 122.

Figure 6C:
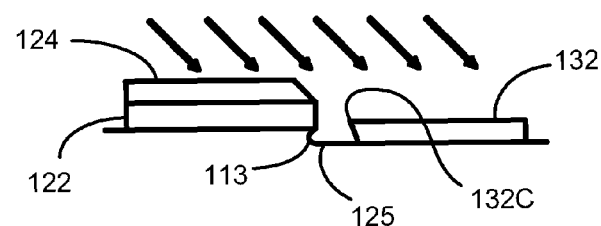

In FIG. 6C, a second conductive material is applied via shadow evaporation or shadow deposition over first layer 122 and a portion of recess 113 of substrate 112. This second conductive material forms layer 124 and layer 132. Layer 124 has a side edge that is aligned with the angle of deposition; that is, the deposited material has an end that is angled in respect to vertical and to the substrate. The previously applied (e.g., deposited) first layer 122 provides a shadow on recessed substrate 113 in which the second material does not deposit, resulting in a portion of substrate 112 having no first or second material thereon. This portion of substrate 112 lacking first and second material is the resulting gap 125. The length of gap 125 is defined by the thickness (in the Z-direction) of layer 122 plus the depth of recess 113 and the tangent of the angle at which deposition occurs.

In an ideal process, layer 132 would have a side edge that is aligned with the angle of deposition. In practical application, however, as ions of the material being deposited impact the corner of layer 132 (designated as corner 132C in FIG. 6C), the impact deforms corner 132C, inhibiting the forming of a sharp corner. End 132b (FIG. 4) and corner 132C could be described as having an unpredictable angle or shape. In some embodiments, the resulting end of layer 132 is angled in the direction of the deposition but at a different angle (e.g., as illustrated in FIGS. 6C through 6E), whereas in other embodiments the end of layer 132 is negative in relation to the direction of the deposition.

Figure 6D:
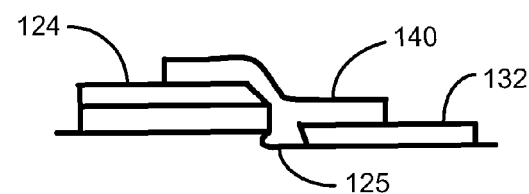
Figure 6E:
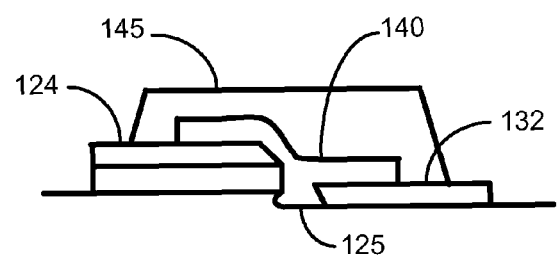

Over at least a portion of layers 122, 124 and layer 132 is deposited a phase change material (e.g., GST) to form a phase change layer 140 that forms a bridge from layer 124 to layer 132 and fills in gap 125; see FIG. 6D. An electrically insulative layer 145 is applied over phase change bridge 140 in FIG. 6E. Phase change layer 140 and insulative layer 145 can be applied by any conventional method, such as sputtering, physical vapor deposition, photolithography or other thin film processing technique.

Thus, embodiments of the SHORT BRIDGE PHASE CHANGE MEMORY CELL are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A phase change memory unit comprising:
    a first electrode proximate a substrate surface, the first electrode comprising a first layer comprising a first conductive material and a second layer comprising a second conductive material, the first electrode having a first end and an opposite second end, the second end at least partially non-orthogonal to the substrate;
    a second electrode proximate the substrate surface spaced from the first electrode, the second electrode comprising the second conductive material and having a first end and a second end, the second end at least partially non-orthogonal to the substrate surface;
    a gap of no more than 100 nm between the first electrode and the second electrode, the gap defined by the second ends of the electrodes;
    a bridge comprising a phase change material contacting the first electrode, the second electrode, and present within the gap; and
    an insulative material adjacent at least a portion of the phase change material.

2. The memory unit of claim 1 wherein the gap is no more than 60 nm.

3. The memory unit of claim 1 wherein the second layer of the first electrode has an end non-orthogonal to the substrate surface.

4. The memory unit of claim 3 wherein the end of the second layer of the first electrode has an angle of about 5 to 60 degrees to the substrate surface.

5. The memory unit of claim 4 wherein the end of the second layer of the first electrode has an angle of about 10 to 25 degrees to the substrate surface.

6. The memory unit of claim 1 wherein the first layer of the first electrode has an end at least approximately orthogonal to the substrate surface.

7. The memory unit of claim 1 wherein the phase change material comprises a binary or ternary compound comprising Ge, Sb and Te.

8. The memory unit of claim 1 wherein substrate proximate the first layer of the first electrode and substrate proximate the second electrode are planar.

9. The memory unit of claim 1 wherein substrate proximate the first layer of the first electrode and substrate proximate the second electrode are not planar.

10. A phase change memory unit comprising:
    a first electrode proximate a substrate surface, the first electrode comprising:
        a first layer comprising a first conductive material and having a first end and an opposite second end; and
        a second layer comprising a second conductive material and having a first end and an opposite second end, the second end non-orthogonal to the substrate surface;
    a second electrode proximate the substrate surface spaced from the first electrode, the second electrode comprising the second conductive material and having a first end and a second end, the second end non-orthogonal to the substrate surface;
    a gap of no more than about 100 nm between the first electrode and the second electrode, the gap defined by the second end of the first layer of the first electrode and the second end of the second electrode;
    a bridge comprising a phase change material contacting the first electrode, the second electrode, and present within the gap; and an insulative material adjacent at least a portion of the phase change material.

11. The memory unit of claim 10 wherein the gap is no more than about 60 nm.

12. The memory unit of claim 11 wherein the gap is no more than about 25 nm.

13. The memory unit of claim 10 wherein the second end of the second layer of the first electrode has an angle of about 5 to 60 degrees to the substrate surface.

14. The memory unit of claim 13 wherein the second end of the second layer of the first electrode has an angle of about 10 to 25 degrees to the substrate surface.

15. The memory unit of claim 10 wherein the phase change material comprises a binary or ternary compound comprising Ge, Sb and Te.

16. The memory unit of claim 10 wherein substrate proximate the first layer of the first electrode and substrate proximate the second electrode are planar.

17. The memory unit of claim 10 wherein substrate proximate the first layer of the first electrode and substrate proximate the second electrode are not planar.

* * * * *